United States Patent
Elliott et al.

(10) Patent No.: US 9,942,975 B2
(45) Date of Patent: Apr. 10, 2018

(54) SCALABLE THERMAL SOLUTION FOR HIGH FREQUENCY PANEL ARRAY APPLICATIONS OR OTHER APPLICATIONS

(71) Applicant: Raytheon Company, Waltham, MA (US)

(72) Inventors: James M. Elliott, Allen, TX (US); James S. Wilson, Hurst, TX (US); David E. Swernofsky, Richardson, TX (US)

(73) Assignee: RAYTHEON COMPANY, Waltham, MA (US)

( * ) Notice: Subject to any disclaimer, the term of this patent is extended or adjusted under 35 U.S.C. 154(b) by 109 days.

(21) Appl. No.: 14/875,222

(22) Filed: Oct. 5, 2015

(65) Prior Publication Data

US 2017/0099726 A1  Apr. 6, 2017

(51) Int. Cl.
*H05K 1/02*  (2006.01)
*H05K 3/30*  (2006.01)
*H05K 1/14*  (2006.01)

(52) U.S. Cl.
CPC ......... *H05K 1/0204* (2013.01); *H05K 1/0209* (2013.01); *H05K 1/142* (2013.01); *H05K 3/301* (2013.01); *H05K 2201/066* (2013.01); *H05K 2201/10242* (2013.01)

(58) Field of Classification Search
CPC .. H05K 1/0204; H05K 3/0061; H05K 1/0203; H05K 3/301; H05K 1/021; H05K 2201/10416; H05K 2201/10318; H05K 2201/1031; H05K 1/142; H05K 2201/066
See application file for complete search history.

(56) References Cited

U.S. PATENT DOCUMENTS

| 3,686,533 | A | * | 8/1972 | Garnier | H01L 25/105 174/535 |
| 5,847,452 | A | * | 12/1998 | Tantoush | H01L 23/4006 257/722 |
| 5,852,548 | A | | 12/1998 | Koon et al. | |
| 6,008,536 | A | * | 12/1999 | Mertol | H01L 23/367 257/704 |
| 6,075,700 | A | * | 6/2000 | Houghton | H01L 23/3675 165/80.2 |
| 6,282,095 | B1 | * | 8/2001 | Houghton | H01L 23/3675 165/80.2 |

(Continued)

FOREIGN PATENT DOCUMENTS

DE   4338392 A1   5/1995
WO   0106821 A1   1/2001

OTHER PUBLICATIONS

Notification of Transmittal of International Search Report and the Written Opinion of the International Searching Authority dated Nov. 17, 2016 in connection with International Application No. PCT/US2016/045928, 10 pages.

*Primary Examiner* — Adam B Dravininkas

(57) ABSTRACT

An apparatus includes a printed circuit board (PCB) including a surface that has a layer of circuitry. The apparatus also includes a heat sink configured to receive heat from the PCB. The apparatus further includes a thermally-conductive post configured to remove the heat from the PCB to the heat sink via thermal conduction through a thermal path. The thermal path is substantially orthogonal to the surface of the PCB. The post includes an end configured to physically couple to the layer of circuitry.

20 Claims, 5 Drawing Sheets

(56) References Cited

U.S. PATENT DOCUMENTS

| | | | |
|---|---|---|---|
| 6,657,864 B1* | 12/2003 | Dyckman | H01L 23/3675 165/80.2 |
| 6,943,436 B2* | 9/2005 | Radu | H01L 23/552 257/659 |
| 7,385,821 B1 | 6/2008 | Feierbach | |
| 2002/0050398 A1* | 5/2002 | Coico | H01L 21/50 174/250 |
| 2002/0084524 A1* | 7/2002 | Roh | H01L 23/3128 257/738 |
| 2004/0212964 A1* | 10/2004 | Belady | H01L 23/36 361/704 |
| 2007/0115643 A1* | 5/2007 | Chen | H01L 23/4006 361/719 |
| 2013/0050954 A1 | 2/2013 | Albrecht, III et al. | |

\* cited by examiner

SCALABLE THERMAL SOLUTION FOR HIGH FREQUENCY PANEL ARRAY APPLICATIONS OR OTHER APPLICATIONS

TECHNICAL FIELD

This disclosure is generally directed to thermal management systems. More specifically, this disclosure relates to a scalable thermal solution for high frequency panel array applications or other applications.

BACKGROUND

A printed circuit board (PCB) typically generates heat during operation of circuitry on or in the PCB. High frequency applications often require small element spacing between circuit components on the PCB, which results from the circuitry spacing dictated by the radio frequency lattice spacing. However, this can create difficulties when trying to cool the circuit components.

One conventional thermal management technique utilizes thermal vias to conduct heat into and through a PCB to a heat sink. However, thermal vias can occupy a relatively large amount of space on a PCB. Moreover, increased thicknesses of PCBs often require vias to increase in size, which again increases the amount of space occupied by the vias on a PCB. In addition, the use of thermal vias typically limits scalability and induces thermal gradients. This complicates the PCB design in addition to the difficulties normally experienced trying to meet the requirements of high frequency applications. Note that using thermal vias within a PCB also requires that the heat be removed from either the other side of the PCB opposite to the circuit element side or at the edges.

Other thermal management techniques include immersion cooling and local boiling of a liquid to a vapor state. However, these techniques often require sealing and could potentially affect both radio frequency (RF) characteristics of devices and affect the devices' long-term reliability. Still other thermal management techniques use internal PCB thermal planes (with and without liquid/vapor chambers), but these also occupy large amounts of space in PCBs.

SUMMARY

This disclosure provides a scalable thermal solution for high frequency panel array applications or other applications.

In a first embodiment, an apparatus includes a printed circuit board (PCB) including a surface that has a layer of circuitry. The apparatus also includes a heat sink configured to receive heat from the PCB. The apparatus further includes a thermally-conductive post configured to remove the heat from the PCB to the heat sink via thermal conduction through a thermal path. The thermal path is substantially orthogonal to the surface of the PCB. The post includes an end configured to physically couple to the layer of circuitry.

In a second embodiment, a system includes one or more PCBs and multiple thermally-conductive posts. The system also includes a heat sink configured to receive heat from the one or more PCBs through the multiple posts. Each PCB includes (i) a surface that has a layer of circuitry and (ii) a surface bonding area within the layer of circuitry. Each post includes an end configured to physically couple to the surface bonding area in the layer of circuitry of a corresponding one of the one or more PCBs. Each post is configured to remove heat from the corresponding PCB to the heat sink via thermal conduction through a thermal path substantially orthogonal to the surface of the corresponding PCB.

In a third embodiment, a method includes printing a layer of circuitry on a surface of a PCB, where the layer of circuitry includes a surface bonding area. The method also includes mounting a heat-generating circuit element on the PCB. The method further includes forming a thermal path substantially orthogonal to the surface of the PCB. The thermal path is formed using a thermally-conductive post thermally connecting the surface bonding area and a heat sink.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 8, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
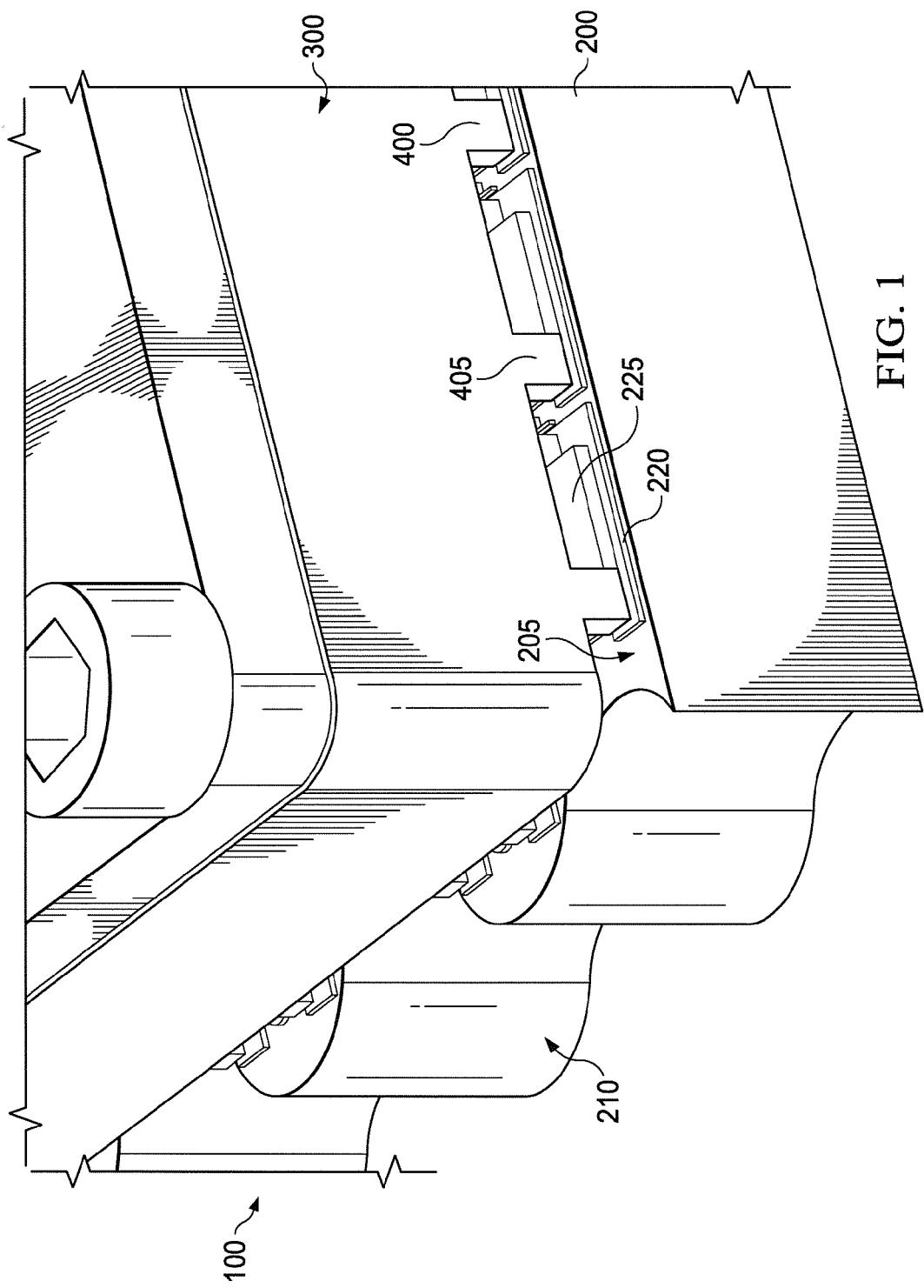
FIGS. 1 and 2 illustrate an example thermal management system according to this disclosure.
Figure 2:
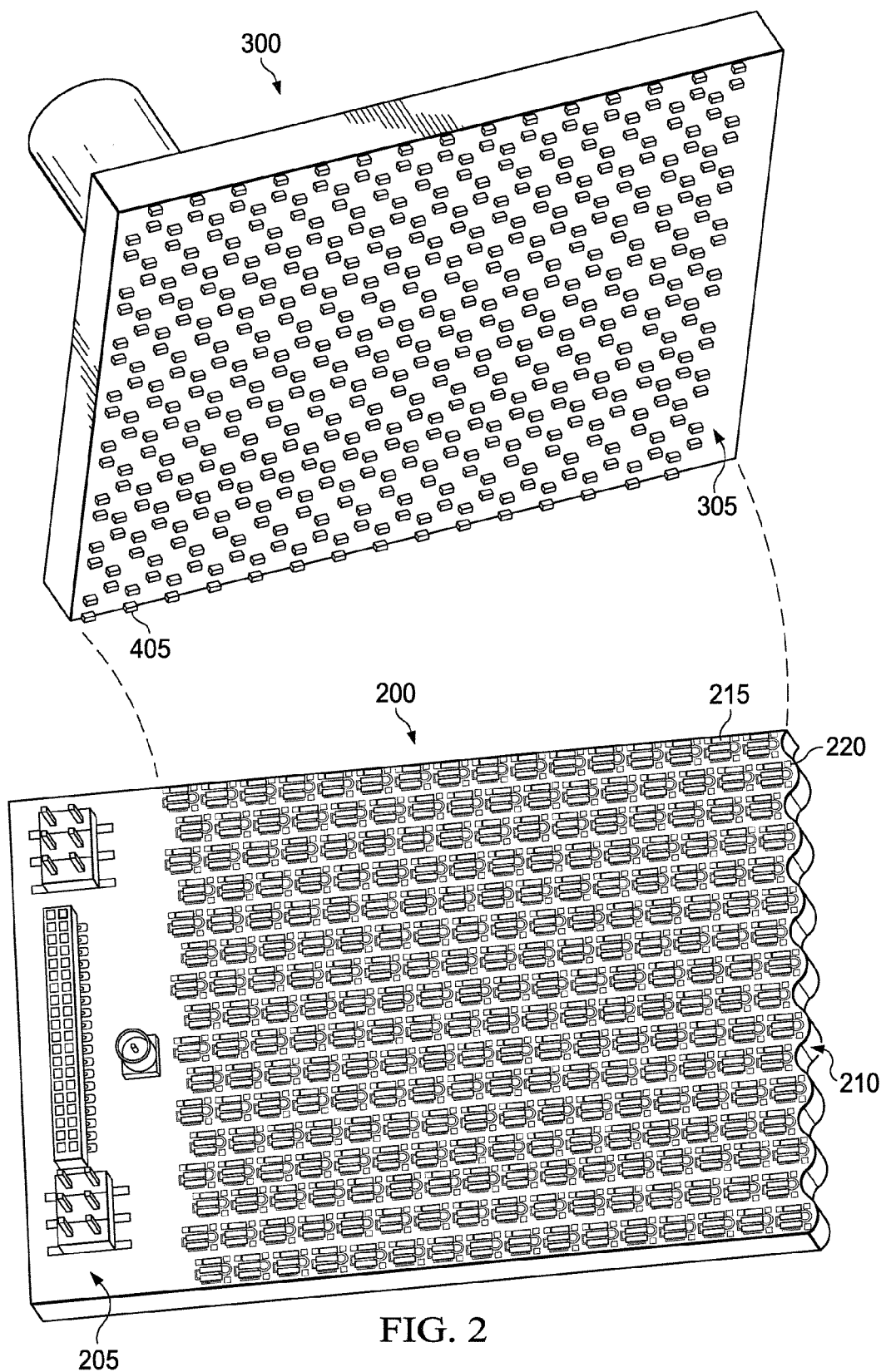

FIGS. 1 and 2 illustrate an example thermal management system 100 according to this disclosure. In particular, FIG. 1 illustrates an assembly view of the thermal management system 100, and FIG. 2 illustrates an exploded view of the thermal management system 100.

As shown in FIGS. 1 and 2, the thermal management system 100 includes a printed circuit board (PCB) 200, a heat sink such as a cold plate 300, and one or more heat transfer posts 400. The thermal management system 100 is configured to remove heat from the PCB 200 and transfer the removed heat to the cold plate 300. This can be done to help cool the PCB 200 and maintain an operating temperature of the PCB 200 in a specified range. As described below, the cold plate 300 contacts the PCB 200 in such a manner that the PCB 200 need not include any thermal vias or channels through the PCB 200 in order to transfer heat from the PCB 200 to the cold plate 300. The embodiments of this disclosure are not limited to a heat sink that is a cold plate, as certain embodiments the heat sink can include a convective air stream, a thermo-electric cooler, and the like.

The PCB 200 includes a top surface 205, a bottom surface, and multiple side surfaces including a side surface 210. The PCB 200 also includes one or more heat generating cells 215 mounted to the top surface 205 of the PCB 200. In the example shown, each heat generating cell 215 includes a ground layer 220 and one or more circuit elements 225. In each cell 215, the ground layer 220 is disposed between the top surface 205 of the PCB 200 and the circuit elements 225. Note that the PCB 200 could include any number of heat generating cells 215, and those heat generating cells 215 may or may not be identical.

As can be seen here, each ground layer 220 extends beyond the associated circuit element(s) 225 in order to contact one or more of the posts 400. The posts 400 therefore provide an efficient way to transfer heat from hot surfaces of the PCB 200 (such as hot surfaces of the ground layers 220) to the cold plate 300. The posts 400 therefore provide thermal conduction through short and highly-conductive thermal paths directly to the cold plate 300.

The posts 400 can help to significantly simplify the design of the PCB 200 by eliminating thermal design features (such as thermal vias) within the PCB 200. In some embodiments, there may be no thermal design features internal to the PCB 200.

One end of each post 400 can be placed in physical contact with a hot surface of the PCB 200, and an opposite end of each post 400 is in physical contact with a lower portion of the cold plate 300 (such as a bottom surface 305 of the cold plate 300). Each post 400 extends in a direction substantially orthogonal to the hot surface of the PCB 200. Depending on the implementation, the posts 400 could be formed integral with the cold plate 300, integral with the PCB 200 (such as with the ground layers 220), or separate from and connected to both the PCB 200 and the cold plate 300.

The posts 400 can be compatible with future automated assembly processes, and the posts 400 can be manufactured using simple machining processes. For example, as shown in FIGS. 1 and 2, the cold plate 300 could include the posts 400 as an integral part of the cold plate 300, such as when the bottom surface 305 of the cold plate 300 is machined to form the posts 400 or when the cold plate 300 is molded to include the posts 400. The posts 400 can be composed of a high thermal conductive material, such as a metal like copper, aluminum, or a metal alloy. Each post can have any suitable size, shape, and dimensions. In this example, the posts 400 have a common shape (a rectangular prism), although this is not required.

A bottom surface 405 of each post 400 is disposed in thermal communication with a top surface of a ground layer 220 of a corresponding cell 215. In some embodiments, the bottom surface 405 of the post 400 can be disposed in direct surface-to-surface contact with the ground layer 220. In other embodiments, a thermal interface material (TIM) is disposed between the bottom surface 405 of the post 400 and the top surface of the ground layer 220. The TIM can help to fill in spaces that may exist between the bottom surface 405 of the post 400 and the top surface of the ground layer 220. The TIM also forms a high thermally-conductive path where heat moves from the ground layer 220 to the post 400. The TIM can be a rigid material, such as epoxy or solder. In particular embodiments, the TIM may be a pliable gap filling material, such as a BERGQUIST thermal interface material. The TIM is usually thin, typically 1-5 mils, but could be thinner or thicker.

The vertical height of each post 400 provides clearance for the associated circuit element 225. For example, the vertical height of each post 400 could represent the height of the associated circuit element 225 plus an additional distance to keep the cold plate 300 from directly contacting the circuit element 225.

As shown in FIG. 2, the heat generating cells 215 can form an array on the PCB 200. In this example, the heat generating cells 215 are disposed in multiple rows, where the heat generating cells 215 in adjacent rows are offset from one another. This arrangement could be used, for instance, in a high frequency application (for example, 33 GHz), such as high frequency planar phased array antennas. For example, this arrangement could be used with a high frequency phased array antenna that includes sixteen rows each containing sixteen heat generating cells 215, where the generating cells 215 represent Q-band unit cells for an antenna. However, this arrangement of heat generating cells 215 is for illustration only, and any other suitable arrangement of heat generating cells 215 could be used and for any other frequency or frequency range as required by the design application. For example, other heat generating cells 215 could be used to implement a driver of a radiator.

In addition to heat dissipation, the posts 400 provide an array structure support to the PCB 200 and provide a platform for including RF absorbing material. For example, the posts 400 could be formed as solid posts, so the posts 400 can remain intact when a force (such as a weight or fastener load) is applied against the posts 400 in a direction toward the PCB 200.

In this way, the system 100 provides a low cost thermal solution that does not require heat to flow into and through a PCB. Moreover, various implementations of the system 600 allow for scalability, minimize thermal gradients, and reduce the complexity of PCB design. In addition, this approach can be done economically. The cost impact to the PCB is minimal since no internal cooling features may be required, and only the incorporation of a surface pad area 245 for each post may be needed. Standard and inexpensive processes can be used to fabricate or attach the posts, and improved thermal paths can be obtained.

Although FIGS. 1 and 2 illustrate one example of a thermal management system 100, various changes may be made to FIGS. 1 and 2. For example, the relative sizes, shapes, and dimensions of the various components shown in FIGS. 1 and 2 are for illustration only. Each component in FIGS. 1 and 2 could have any other size, shape, and dimensions. Also, the use of a cold plate 300 in conjunction with posts 400 that contact portions of heat generating cells 215 could be used with any homogenous or heterogeneous heat generating cells 215. Further, FIGS. 1 and 2 show a single post 400 contacting each ground layer 220, but multiple posts 400 could contact each ground layer 220. In addition, other types of posts 400 could be used in the thermal management system 100, such as the posts described in FIG. 5 below. Also, the bottom surface of the PCB 200 can be similar to the top surface 205 by including another set of heat generating cells. That is, the bottom surface of the PCB 200 can include a ground layer to which one or more circuit elements are mounted. The bottom surface of the PCB 200 can further include posts (such as the posts 400 or the posts described in FIG. 5 below) that provide thermal conduction through short and highly-conductive thermal paths directly to a heat sink, such as another cold plate disposed below the PCB 200.

Figure 3:
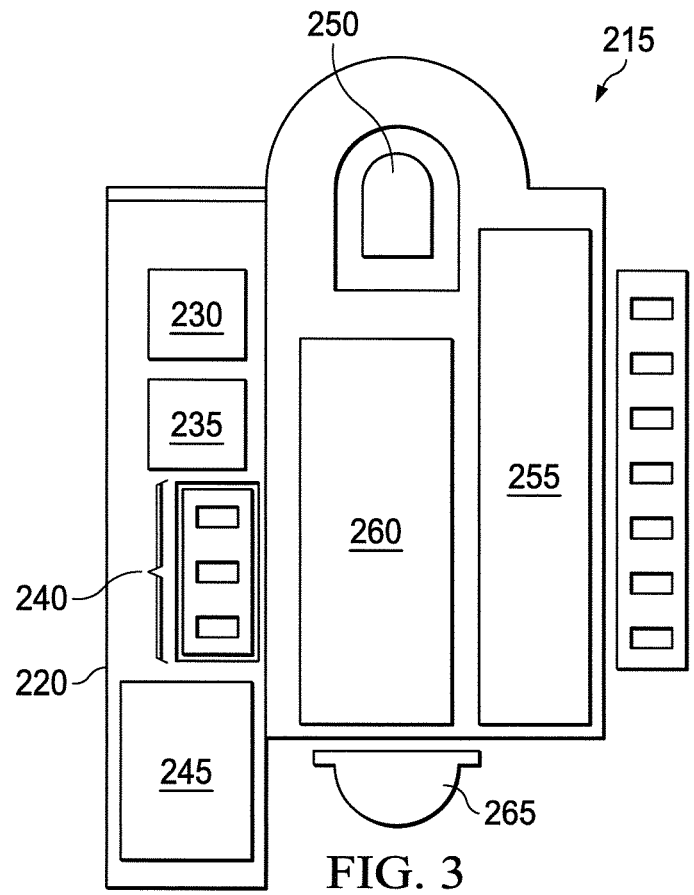
FIG. 3 illustrates an example heat generating cell of the system of FIG. 1 according to this disclosure.

FIG. 3 illustrates an example heat generating cell 215 of the system 100 of FIG. 1 according to this disclosure. Although certain details will be provided with reference to the components of the heat generating cell 215, it should be understood that other embodiments may include more, less, or different components. In this example, the heat generating cell 215 represents a Q-band unit cell for an antenna in a high frequency planar phased array, although any other suitable heat generating cell 215 could be used.

As shown in FIG. 3, the heat generating cell 215 includes the ground layer 220, which is composed of an electrically-conductive material like copper or gold. The heat generating cell 215 also includes a first capacitor 230, a second capacitor 235, a surface bond pad 240, and a surface pad area 245 configured to contact a post 400. The heat generating cell 215 further includes a first RF pad 250, an application specific integrated circuit (ASIC) or other processing device 255, a monolithic microwave integrated circuit (MMIC) or other integrated circuit 260, and a second RF pad 265. The capacitors 230 and 235, the processing device 255, and the integrated circuit 260 can be disposed over the ground layer 220. Note, however, that other components do not overlap or block the surface pad area 245, which allows a post 400 to make thermal contact with the ground layer 220 via the surface pad area 245. The surface bond pad 240 can be composed of the same material as the ground layer 220 and can be disposed coplanar with the ground layer 220. The integrated circuit 260 could represent any suitable integrated circuit, such as a MMIC high power amplifier (HPA).

Although FIG. 3 illustrates one example of a heat generating cell 215, various changes may be made to FIG. 3. For example, the relative sizes, shapes, and dimensions of the various components shown in FIG. 3 are for illustration only. Each component in FIG. 3 could have any other size, shape, and dimensions. Also, the heat generating cell can include a different type of circuitry.

Figure 4:
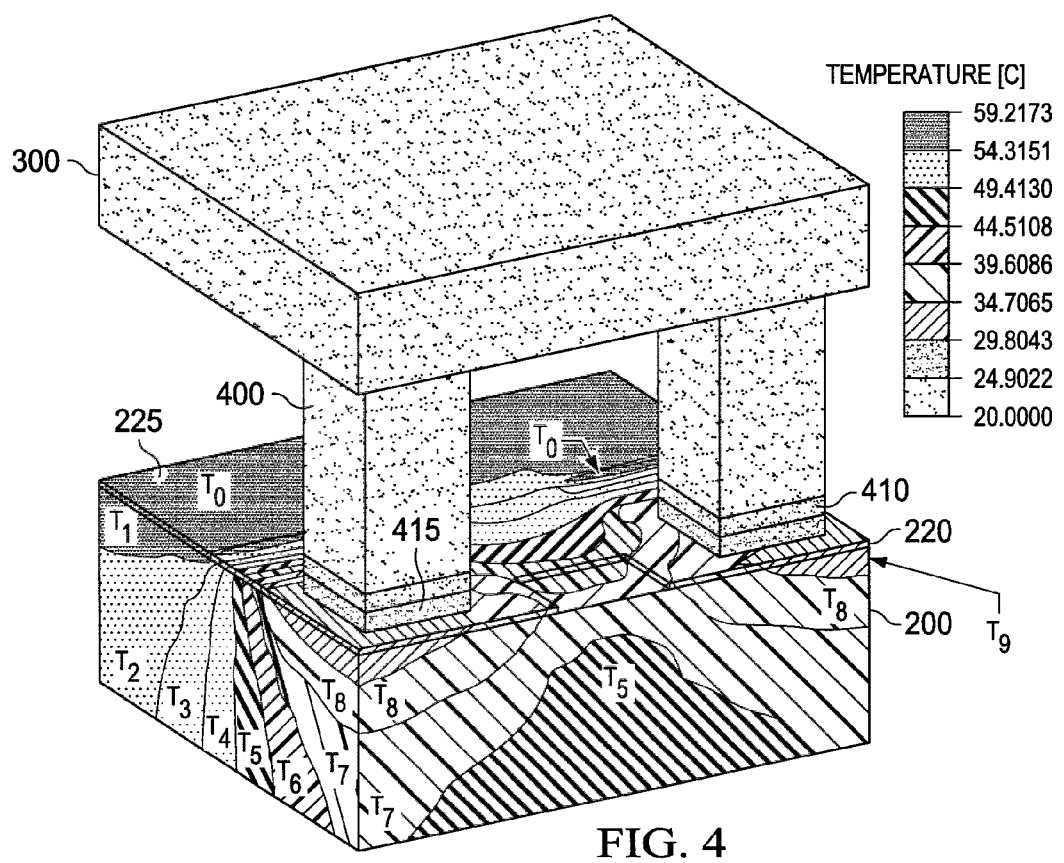
FIG. 4 illustrates an example thermal analysis of an operation of the thermal management system of FIG. 1 according to this disclosure.

FIG. 4 illustrates an example thermal analysis of an operation of the thermal management system 100 of FIG. 1 according to this disclosure. In some embodiments, a Q-Band application requires an MMIC mounting temperature of less than about 80° C. As shown in FIG. 4, the thermal management system 100 provides a MMIC mounting temperature of about 59° C., which provides a substantial margin between the specified requirements and the performance of the system 100. In the example shown, the entire cold plate 300 has a temperature of about 20° C. or less.

In FIG. 4, two of the posts 400 are connected to the ground layer 220 of the heat generating cell 215. A majority of each post 400 has a temperature of about 20° C. or less. Only a small portion 410 of each post 400 near the bottom of each post 400 has a warmer temperature, typically in the range of about 20° C. to about 22.9° C. The posts 400 can provide thermal paths with uniform heat transfer rates, and the majority of the height of each post 400 is as cold as the cold plate 300.

Here, a TIM 415 is used between the posts 400 and the ground layer 220. The TIM 415 has temperatures in the range of about 24.9° C. (near the bottom of each post 400) to about 39.6° C. (near the ground layer 220).

In the example shown, the PCB 200 exhibits different temperatures that are related to (i) proximity to a circuit element 225 that generates heat and transfers the heat to the PCB 200 and (ii) proximity to the posts 400 that remove heat from the PCB 200. The PCB 200 exhibits temperatures $T_1$-$T_N$ in various areas, where $T_1 > T_2$, $T_2 > T_3$, ..., $T_{N-1} > T_N$. The hottest area of the PCB 200 here is located directly under the circuit element 225 and near the top surface 205 of the PCB. The coolest areas of the PCB 200 can be located directly under the surface pads 245 of the ground layer 220 that contact the posts 400.

Figure 5:
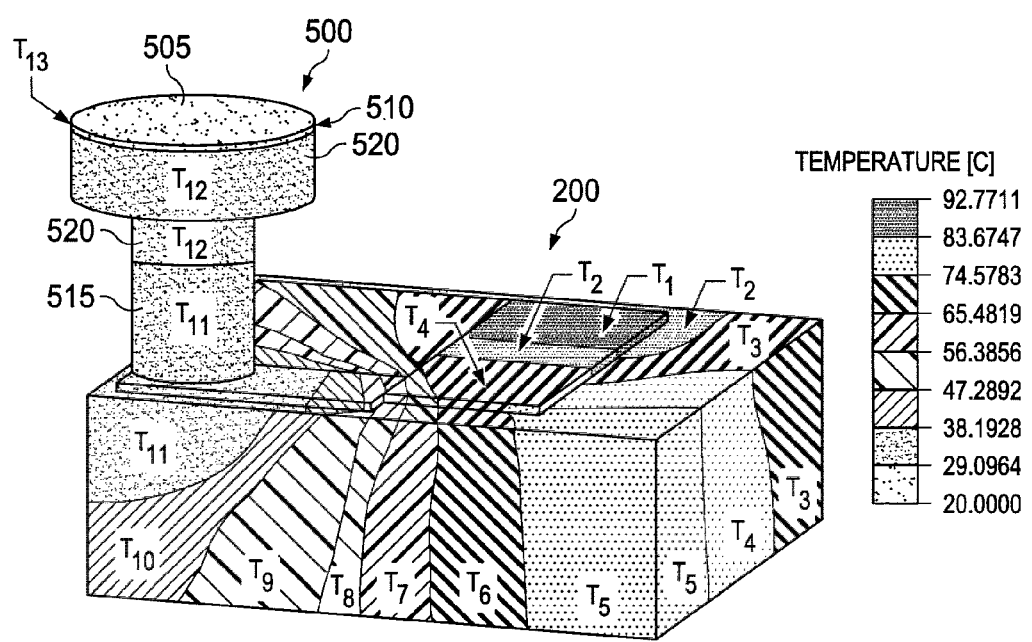
FIG. 5 illustrates an example thermal analysis of an operation of another thermal management system according to this disclosure.

FIG. 5 illustrates a thermal analysis of an operation of another thermal management system 501 according to this disclosure. The thermal management system 501 here includes one or more heat transfer posts 500, which are attached to the PCB 200 via soldering or other mechanism. The heat transfer posts 500 can also be physically connected to a cold plate, such as through a surface-to-surface connection or through a highly-conductive thermal interface. The thermal management system 501 also includes a layer of TIM 505 that connects a top surface 510 of the post 500 with a bottom surface of the cold plate. In the event of rework or disassembly, removing/replacing a layer of TIM 505 is a simpler, faster, and less destructive process than removing/replacing solder.

The post 500 here has a variable cross-sectional shape, namely the top of the post 500 is wider than a bottom of the post 500. This enables the post 500 to occupy a smaller surface area on the heat generating cells 215, while at the same time providing a larger surface area for conducting heat to the cold plate. In comparison to a post 400 that has uniform lateral cross-sections, the larger surface area at the top of the post 500 provides more thermal conduction and increases the rate of heat removal. As the layer of TIM 505 may have a lower thermal conductivity than the post 500, the larger top surface 510 can help to improve the rate of transferring heat across the TIM 505. The embodiments of this disclosure are not limited to posts that have uniform lateral cross-sections, as certain embodiments include posts that are not uniform in cross-section. The embodiments of this disclosure are not limited to posts that are identical to each other, as certain embodiments include posts that are not identical to each other. Non-identical posts can vary in dimensions, shape, materials, or another characteristic.

In this particular embodiment, the post 500 includes a nail head shape, with a narrower-radius cylindrical lower portion 515 and a wider-radius cylindrical upper portion 520. In other embodiments, the post 500 could have another shape, such as a pyramid, a truncated pyramid, a cone, or a truncated cone.

In the example shown, the post 500 exhibits temperatures in a range of about 20° C. to about 29.1° C. The areas of transition from the lower portion 515 to the upper portion 520 exhibit a temperature that is in a range of about 20° C. to about 29.1° C.

Although FIGS. 4 and 5 illustrate examples of thermal analyses of thermal management systems, various changes may be made to FIGS. 4 and 5. For example, the relative sizes, shapes, and dimensions of the various components shown in FIGS. 4 and 5 are for illustration only. Each component in FIGS. 4 and 5 could have any other size, shape, and dimensions. Also, the temperatures shown in FIGS. 4 and 5 are specific examples only and do not limit this disclosure to any particular temperatures or temperature ranges.

Figure 6:
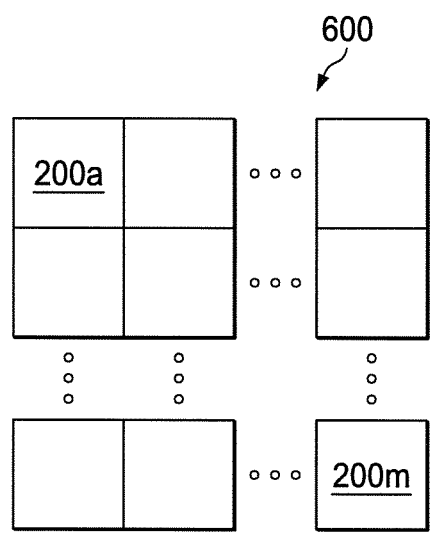
FIG. 6 illustrates an example of the scalability of the thermal management system of FIG. 1 according to this disclosure.

FIG. 6 illustrates an example of the scalability of the thermal management system 100 of FIG. 1 according to this disclosure. To take advantage of economies of scale, a manufacturer can produce multiple PCBs 200a-200m, each of which could be identical to the PCB 200 of FIG. 1. The manufacturer can form a multi-PCB thermal management system 600 by coupling the multiple PCBs 200a-200m to each other in any suitable arrangement. The PCBs 200a-200m can be coupled to each other in any suitable manner, such as by using an adhesive. The manufacturer can also produce a single cold plate or multiple cold plates configured to contact the PCBs 200a-200m.

Each of the PCBs can be configured to operate or remain operable while one or more of its lateral side surfaces are in physical contact with one or more other PCBs. In the event that a portion of the multi-PCB thermal management system 600 is damaged, that portion can be repaired/replaced, as opposed to repairing/replacing the entire multi-PCB thermal management system 600. For example, when a subset of the PCBs 200a-200m is damaged, the damaged subset of PCBs can be replaced without repair/replacement of undamaged components of the system 600.

Note that the system 600 is not limited to using identical heat generating cells on the PCBs. Any number(s) and type(s) of heat generating cells could be used in the system 600. Also note that the 600 could use any suitable posts with one or more cold plates, such as posts 400 integrated with the cold plate(s) or posts 500 attached to the cold plate(s).

Although FIG. 6 illustrates one example of the scalability of the thermal management system, various changes may be made to FIG. 6. For example, the relative sizes, shapes, and dimensions of the various components shown in FIG. 6 are for illustration only. Each component in FIG. 6 could have any other size, shape, and dimensions. Also, the multiple PCBs 200a-200m can be arranged in any suitable fashion.

Figure 7:
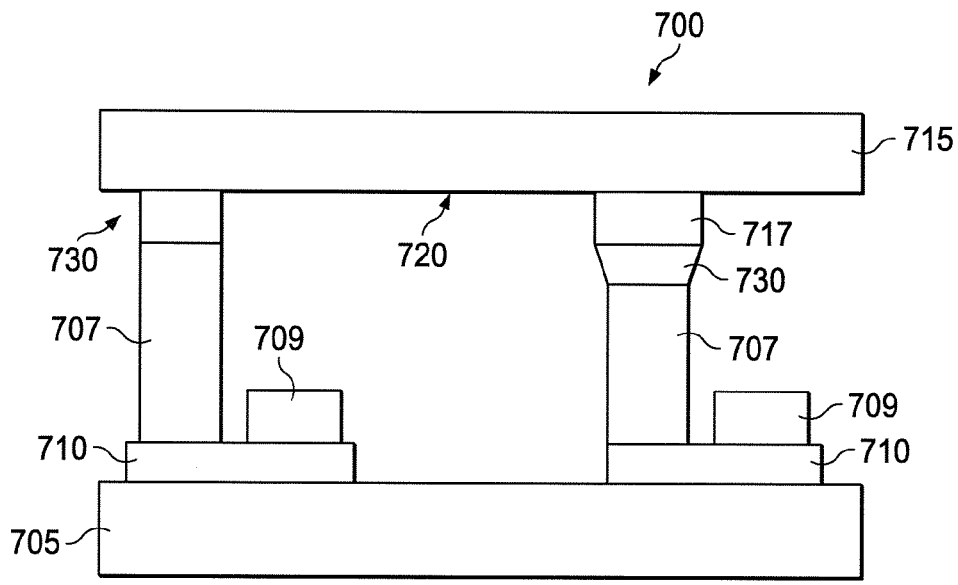
FIG. 7 illustrates an example hybrid embodiment of a thermal management system according to this disclosure.

FIG. 7 illustrates a hybrid embodiment of a thermal management system 700 according to this disclosure. As shown in FIG. 7, the hybrid thermal management system 700 includes a PCB 705 with an arrangement of uniform narrow posts 707 soldered or otherwise connected to a circuitry layer 710, as well as heat generating cells 709. The uniform narrow posts 707 can be the same as or similar to the narrow radius cylindrical lower portion 515 or the post 400. The hybrid thermal management system 700 also includes a cold plate 715 with a corresponding arrangement of uniform wider posts 717 machined to its bottom surface 720. A layer of TIM 730 is placed between the top surfaces of each of the uniform narrow posts 707 of the PCB 705 and a bottom surface of each of the uniform wider posts 717 of the cold plate 715 or between the bottom surface of the cold plate 715 and the uniform narrow posts 707. The uniform wider posts 717 can be the same as or similar to the wider radius cylindrical upper portion 520 or a truncated post 400. Accordingly, the thermal management system 700 includes a layer of TIM 730 between the surfaces where the cold plate 715 and the PCB 705 meet, whether the post is integral to the PCB or the cold plate.

Although FIG. 7 illustrates one example of a hybrid embodiment of a thermal management system, various changes may be made to FIG. 7. For example, the relative sizes, shapes, and dimensions of the various components shown in FIG. 7 are for illustration only. Each component in FIG. 7 could have any other size, shape, and dimensions.

Figure 8:
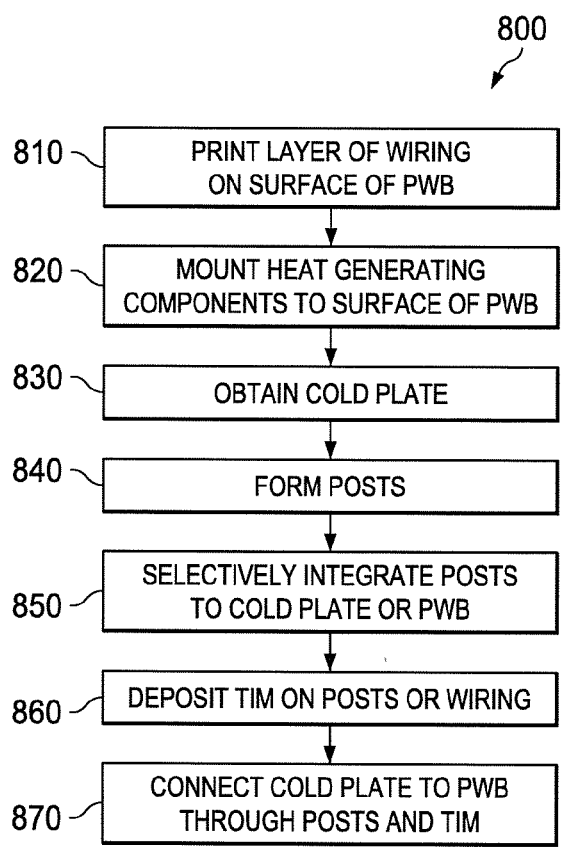
FIG. 8 illustrates an example method of manufacturing a scalable thermal solution for high frequency panel array applications or other applications according to this disclosure.

FIG. 8 illustrates an example method 800 of manufacturing a scalable thermal solution for high frequency panel array applications or other applications according to this disclosure. A layer of circuitry is printed on a surface of a PCB at step 810. This could include, for example, printing the ground layer 220 and other wiring using a high thermally and electrically conductive material (such as copper or gold). As part of this step, one or more surface bonding areas 245 can be formed in the layer of circuitry. Each surface bonding area 245 is configured to physically couple to a post 400 or 500. One or more heat generating components are mounted to the surface of the PCB at step 820. This could include, for example, mounting circuit elements 225 to the ground layer 220 without covering the surface bonding areas 245.

A cold plate is obtained at step 830, and posts are formed at step 840. This could include, for example, manufacturing or otherwise obtaining a cold plate having integrated posts, or manufacturing or otherwise obtaining a cold plate and separate posts. If the posts are separate, the posts are integrated with the cold plate or the PCB at step 850. This could include, for example, soldering or otherwise attaching the posts to the PCB or the cold plate. Optionally, TIM can be deposited at step 860. This could include, for example, depositing the TIM at the exposed ends of the posts. The cold plate is connected to the PCB through the posts and the optional TIM at step 870. This could include, for example, placing ends of the posts 400 on the ground layers 220 or placing the bottom surface of the cold plate 300 on the posts 400.

Although FIG. 8 illustrate one example of method of manufacturing a scalable thermal solution for high frequency panel array applications or other applications, various changes may be made to FIG. 8. For example, while shown as a series of steps, various steps in FIG. 8 could overlap, occur in parallel, occur in a different order, or occur any number of times.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. An apparatus comprising:
   a printed circuit board (PCB) including a surface that has a layer of circuitry, the layer of circuitry comprising a heat-generating cell that includes (i) a circuit element and (ii) a ground layer disposed between the surface of the PCB and the circuit element;
   a heat sink configured to receive heat from the PCB; and
   a thermally-conductive post configured to remove the heat from the PCB to the heat sink via thermal conduction through a thermal path, the thermal path substantially orthogonal to the surface of the PCB, the thermally-conductive post including an end configured to directly couple to the ground layer.

2. The apparatus of claim 1, wherein the ground layer includes a surface bonding area located where the ground layer extends beyond the circuit element, the surface bonding area configured to directly couple to the end of the thermally-conductive post.

3. The apparatus of claim 1, wherein the thermally-conductive post has a uniform cross-section along the thermally-conductive post.

4. The apparatus of claim 1, wherein the thermally-conductive post has a smaller cross-section at the end configured to directly couple to the ground layer and a larger cross-section at an opposing end.

5. The apparatus of claim 1, wherein at least part of the thermally-conductive post is integral with the heat sink.

6. The apparatus of claim 1, wherein at least part of the thermally-conductive post is secured to the PCB and connected to the heat sink.

7. The apparatus of claim 1, further comprising:
   a thermal interface material disposed between the thermally-conductive post and the ground layer.

8. The apparatus of claim 1, further comprising:
   additional circuitry mounted on the PCB, the additional circuitry configured to generate heat during operation and to transfer at least some of the heat to the PCB.

9. A system comprising:
   one or more printed circuit boards (PCBs);
   multiple thermally-conductive posts; and
   a heat sink configured to receive heat from the one or more PCBs through the multiple thermally-conductive posts;
   wherein each PCB comprises a surface that has a layer of circuitry, the layer of circuitry comprising a heat-generating cell that includes (i) a circuit element and (ii) a ground layer disposed between the surface of that PCB and the circuit element, the ground layer including a surface bonding area located where the ground layer extends beyond the circuit element;
   wherein each post comprises an end configured to physically couple to the surface bonding area of the ground layer of a corresponding one of the one or more PCBs; and
   wherein each post is configured to remove heat from the corresponding PCB to the heat sink via thermal conduction through a thermal path substantially orthogonal to the surface of the corresponding PCB.

10. The system of claim 9, wherein the one or more PCBs comprise multiple PCBs disposed adjacent to each other and configured to operate while the PCBs are in physical contact with each other.

11. The system of claim 9, wherein at least one of the thermally-conductive posts has a uniform cross-section along the thermally-conductive post.

12. The system of claim 9, wherein at least one of the thermally-conductive posts has a smaller cross-section at the end configured to physically couple to the ground layer of the corresponding PCB and a larger cross-section at an opposing end.

13. The system of claim 9, wherein at least part of one or more of the thermally-conductive posts is integral with the heat sink.

14. The system of claim 9, wherein at least part of one or more of the thermally-conductive posts is secured to the one or more PCBs and connected to the heat sink.

15. The system of claim 9, further comprising:
    a thermal interface material disposed between each post and the ground layer of the corresponding PCB.

16. The system of claim 9, further comprising:
    additional circuitry mounted on the one or more PCBs, the additional circuitry configured to generate heat during operation and to transfer at least some of the heat to the one or more PCBs.

17. A method comprising:
    printing a ground layer on a surface of a printed circuit board (PCB), the ground layer including a surface bonding area;
    mounting a heat-generating circuit element on the ground layer such that the circuit element does not overlap or block the surface bonding area; and
    forming a thermal path substantially orthogonal to the surface of the PCB, the thermal path formed using a thermally-conductive post directly connecting the surface bonding area and a heat sink.

18. The method of claim 17, wherein at least part of the thermally-conductive post is integral with the heat sink.

19. The method of claim 17, wherein forming the thermal path comprises:
    disposing a thermal interface material between the thermally-conductive post and at least one of: the ground layer and the heat sink.

20. The method of claim 17, wherein the thermally-conductive post has one of:
    a uniform cross-section along the thermally-conductive post; and
    a smaller cross-section at an end of the thermally-conductive post configured to directly couple to the ground layer and a larger cross-section at an opposing end.

* * * * *